United States Patent
Yang et al.

(10) Patent No.: US 12,289,954 B2
(45) Date of Patent: Apr. 29, 2025

(54) DISPLAY PANEL, MANUFACTURING METHOD THEREOF, AND DISPLAYING DEVICE

(71) Applicants: Chengdu BOE Optoelectronics Technology Co., Ltd., Chengdu (CN); BOE Technology Group Co., Ltd., Beijing (CN)

(72) Inventors: Jibum Yang, Beijing (CN); Euiku Lee, Beijing (CN); Myoungsoo Lee, Beijing (CN); Chao Kong, Beijing (CN); Lin Guo, Beijing (CN); Na Li, Beijing (CN); Haijun Qiu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 921 days.

(21) Appl. No.: 17/356,364

(22) Filed: Jun. 23, 2021

(65) Prior Publication Data
US 2022/0158136 A1    May 19, 2022

(30) Foreign Application Priority Data
Nov. 18, 2020   (CN) .......................... 202011296663.4

(51) Int. Cl.
*H10K 59/12*        (2023.01)
*H10K 50/86*        (2023.01)
(Continued)

(52) U.S. Cl.
CPC ........... *H10K 50/86* (2023.02); *H10K 50/865* (2023.02); *H10K 59/122* (2023.02); *H10K 71/00* (2023.02); *H10K 59/1201* (2023.02); *H10K 59/38* (2023.02)

(58) Field of Classification Search
CPC ........ H10K 59/12; H10K 59/38; H10K 59/80; H10K 59/122; H10K 59/1201;
(Continued)

(56) References Cited

U.S. PATENT DOCUMENTS

2006/0131580 A1    6/2006   Yang et al.
2006/0267485 A1   11/2006   Wood et al.
(Continued)

FOREIGN PATENT DOCUMENTS

CN    1729584 A    2/2006
CN    1790144 A    6/2006
(Continued)

OTHER PUBLICATIONS

CN202011296663.4 first office action.
CN202011296663.4 second office action.

*Primary Examiner* — Chuong A Luu
(74) *Attorney, Agent, or Firm* — IPro, PLLC

(57) ABSTRACT

Disclosed are a display panel, a manufacturing method thereof and a displaying device. The display panel comprises a driving backplane, a light-emitting device layer disposed on the driving backplane, and an encapsulation layer, a color film layer and a color separation suppression layer which are disposed on the side, away from the driving backplane, of the light-emitting device layer, wherein the color separation suppression layer is configured to interfere with and cancel out external ambient light, so as to reduce the external ambient light incident on the light-emitting device layer and the driving backplane and block the external ambient light reflected by the light-emitting device layer and the driving backplane from exiting from a light-exiting surface of the display panel.

19 Claims, 3 Drawing Sheets

(51) Int. Cl.
*H10K 59/122* (2023.01)
*H10K 71/00* (2023.01)
*H10K 59/38* (2023.01)

(58) Field of Classification Search
CPC ........... H10K 59/8731; H10K 59/8792; H10K 50/86; H10K 50/865; H10K 71/00; H10K 59/40; H10K 59/50; H10K 59/60; H10K 59/131; H10K 59/352; H10K 59/873; H10K 59/8791
USPC .......................................................... 257/40
See application file for complete search history.

(56) References Cited

U.S. PATENT DOCUMENTS

2014/0361682 A1 12/2014 Cho et al.
2021/0296619 A1* 9/2021 Wang .................... H10K 71/00

FOREIGN PATENT DOCUMENTS

| CN | 107331688 A | 11/2017 |
| CN | 108666344 A | 10/2018 |

* cited by examiner

DISPLAY PANEL, MANUFACTURING METHOD THEREOF, AND DISPLAYING DEVICE

CROSS REFERENCE TO RELATED APPLICATIONS

The application claims priority to Chinese patent application filed in the China National Intellectual Property Administration on Nov. 18, 2020 with application number 202011296663.4 and title of "Display Panel, Manufacturing Method thereof and Displaying Device", the entire contents of which are hereby incorporated by reference.

TECHNICAL FIELD

The disclosure relates to the technical field of display, in particular to a display panel, a manufacturing method thereof and a displaying device.

BACKGROUND

An organic light-emitting diode (OLED) display panel needs to be provided with a polarizer on a light-exiting side in order to prevent a screen from reflecting light. Based on the principle of polarized light, the polarizer can effectively reduce the reflection intensity of external ambient light on the screen. However, the polarizer is thick. In order to reduce the thickness of the display panel, a color film layer can be used instead of the polarizer to reduce the reflection intensity of external ambient light on the screen.

SUMMARY

The disclosure provides a display panel, a manufacturing method thereof and a displaying device.

The disclosure provides a display panel, comprising:
a driving backplane;
a light-emitting device layer disposed on the driving backplane; and
an encapsulation layer, a color film layer and a color separation suppression layer which are disposed on the side, away from the driving backplane, of the light-emitting device layer;
  wherein the color separation suppression layer is configured to interfere with and cancel out external ambient light, so as to reduce the external ambient light incident on the light-emitting device layer and the driving backplane and block the external ambient light reflected by the light-emitting device layer and the driving backplane from exiting from a light-exiting surface of the display panel.

Optionally, the color separation suppression layer comprises at least one barrier layer, four times of the product of the thickness and refractive index of each barrier layer is an odd multiple of a preset wavelength, and the preset wavelength is a wavelength corresponding to external ambient light that the barrier layer needs to interfere with and cancel out.

Optionally, the color separation suppression layer comprises at least two barrier layers, and the wavelengths corresponding to external ambient light that any two of the barrier layers interfere with and cancel out are different.

Optionally, the encapsulation layer, the color film layer and the color separation suppression layer are sequentially arranged away from the light-emitting device layer in the direction perpendicular to the light-emitting device layer.

Optionally, the encapsulation layer, the color separation suppression layer and the color film layer are sequentially arranged away from the light-emitting device layer in the direction perpendicular to the light-emitting device layer.

Optionally, the color film layer, the encapsulation layer, and the color separation suppression layer are sequentially arranged away from the light-emitting device layer in the direction perpendicular to the light-emitting device layer.

Optionally, the color film layer, the color separation suppression layer and the encapsulation layer are sequentially arranged away from the light-emitting device layer along the direction perpendicular to the light-emitting device layer.

Optionally, the color separation suppression layer, the encapsulation layer and the color film layer are sequentially arranged away from the light-emitting device layer in the direction perpendicular to the light-emitting device layer.

Optionally, the color separation suppression layer, the color film layer and the encapsulation layer are sequentially arranged away from the light-emitting device layer along the direction perpendicular to the light-emitting device layer.

Optionally, the material of the color separation suppression layer is an organic material, metal or metal oxides.

Optionally, the light-emitting device layer comprises an anode layer disposed on the driving backplane and a pixel defining layer disposed on the anode layer, and the pixel defining layer has a plurality of opening areas; and
  the light-emitting device layer further comprises an organic functional layer disposed in the opening areas, and a cathode layer covering the pixel defining layer and the organic functional layer.

Optionally, the material of the pixel defining layer is a black shading material.

Optionally, the light-emitting device layer further comprises a light shielding layer disposed between the pixel defining layer and the cathode layer, and the light shielding layer is located on the surface, away from the driving backplane, of the pixel defining layer; and
  the material of the light shielding layer is a black shading material.

Optionally, the material of the light shielding layer is MoOx or a black resin material.

Optionally, the color film layer comprises a plurality of color film units, each color film unit comprises a color resistance unit and a black matrix surrounding the color resistance unit;
  wherein a front projection of the color resistance unit on the driving backplane covers a front projection of the organic functional layer in the corresponding opening area on the driving backplane, and a front projection of the black matrix on the driving backplane is located within a front projection of a peripheral area between two adjacent opening areas on the driving backplane.

The disclosure further provides a manufacturing method of a display panel, comprising:
providing a driving backplane;
forming a light-emitting device layer on the driving backplane; and
forming an encapsulation layer, a color film layer and a color separation suppression layer on the side, away from the driving backplane, of the light-emitting device layer;
  wherein the color separation suppression layer is configured to interfere with and cancel out external ambient light, so as to reduce the external ambient light incident on the light-emitting device layer and the driving backplane and block the external ambient light reflected by the light-emitting device layer and the driving backplane from exiting from a light-exiting surface of the display panel.

Optionally, forming the encapsulation layer, the color film layer and the color separation suppression layer on the side, away from the driving backplane, of the light-emitting device layer comprises:

sequentially forming the encapsulation layer, the color film layer and the color separation suppression layer on the side, away from the driving backplane, of the light-emitting device layer;

or sequentially forming the encapsulation layer, the color separation suppression layer and the color film layer on the side, away from the driving backplane, of the light-emitting device layer;

or sequentially forming the color film layer, the encapsulation layer and the color separation suppression layer on the side, away from the driving backplane, of the light-emitting device layer;

or sequentially forming the color film layer, the color separation suppression layer and the encapsulation layer on the side, away from the driving backplane, of the light-emitting device layer;

or sequentially forming the color separation suppression layer, the encapsulation layer and the color film layer on the side, away from the driving backplane, of the light-emitting device layer;

or sequentially forming the color separation suppression layer, the color film layer and the encapsulation layer on the side, away from the driving backplane, of the light-emitting device layer.

Optionally, forming the light-emitting device layer on the driving backplane comprises:

forming an anode layer on the driving backplane;
forming a pixel defining layer on the anode layer, wherein the pixel defining layer has a plurality of opening areas;
forming an organic functional layer in the opening areas; and
forming a cathode layer covering the pixel defining layer and the organic functional layer.

Optionally, after forming the pixel defining layer on the anode layer, the method further comprises:

forming a light shielding layer on the surface, away from the driving backplane, of the pixel defining layer;
wherein the cathode layer also covers the light shielding layer, and the material of the light shielding layer is a black shading material.

The disclosure further provides a displaying device, comprising a cover plate and the above display panel; and
wherein the cover plate is arranged on a light-exiting surface of the display panel.

The above description is only an overview of the technical solution of this disclosure, which can be implemented according to the contents of the specification in order to understand the technical means of this disclosure more clearly, and in order to make the above and other objects, features and advantages of this disclosure more obvious and understandable, the detailed description of this disclosure will be given below.

BRIEF DESCRIPTION OF THE DRAWINGS

In order to explain the technical solution in the embodiments of the disclosure or related arts more clearly, the drawings used in the description of the embodiments or related arts will be briefly introduced below. Obviously, the drawings in the following description are only some embodiments of the disclosure, and for those of ordinary skill in the art, other drawings can be obtained according to these drawings without paying creative labor.

DETAILED DESCRIPTION

In order to make the above objects, features and advantages of the disclosure more obvious and understandable, the disclosure will be further described in detail with reference to the accompanying drawings and specific embodiments. Obviously, the described embodiments are part of the embodiments of this disclosure, but not all of them. Based on the embodiments in this disclosure, all other embodiments obtained by those of ordinary skill in the art without creative labor belong to the protection scope of this disclosure.

Figure 1:
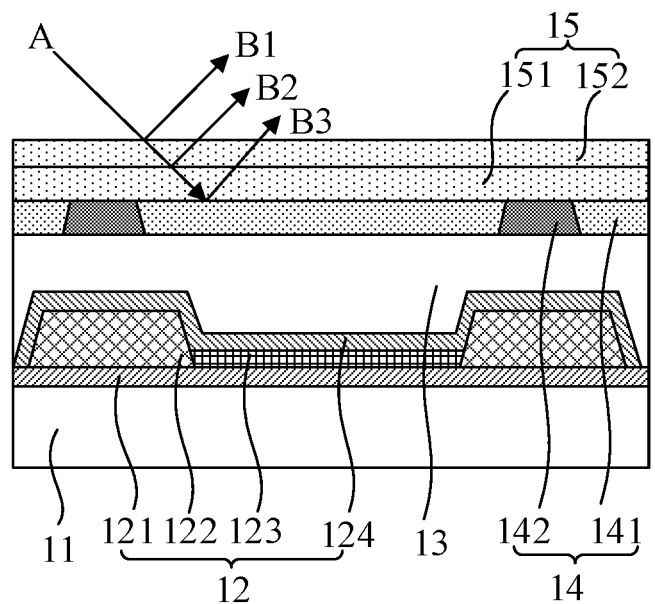
FIG. 1 is a structural diagram of a display panel according to an embodiment of the disclosure.
Figure 2:
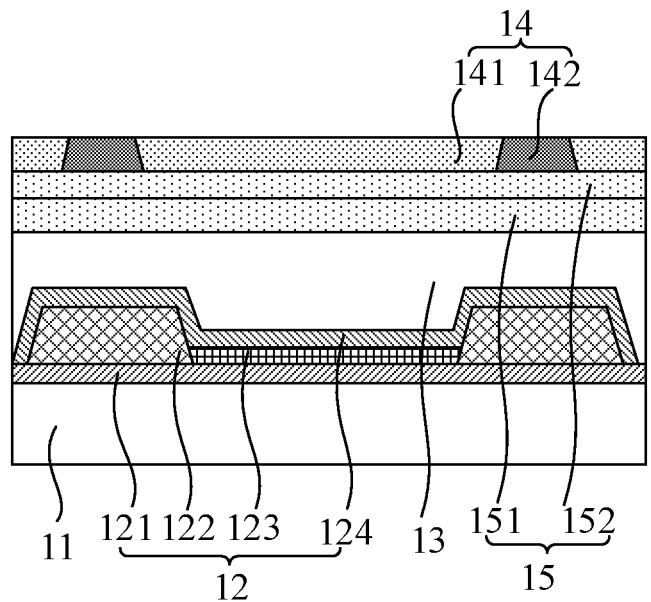
FIG. 2 is a structural diagram of another display panel according to an embodiment of the disclosure.
Figure 3:
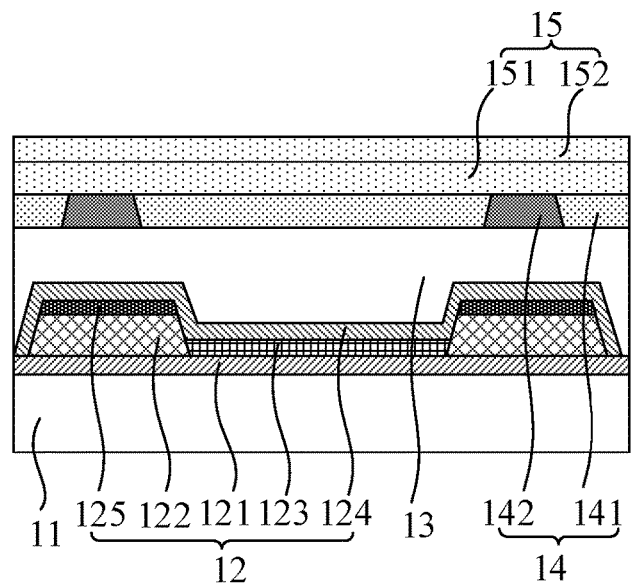
FIG. 3 is a structural diagram of yet another display panel according to an embodiment of the disclosure.

FIG. 1 is a structural diagram of a display panel according to an embodiment of the disclosure; FIG. 2 is a structural diagram of another display panel according to an embodiment of the disclosure; and FIG. 3 is a structural diagram of yet another display panel according to an embodiment of the disclosure.

An embodiment of the disclosure provides a display panel, which comprises a driving backplane 11, a light-emitting device layer 12 disposed on the driving backplane 11, and an encapsulation layer 13, a color film layer 14 and a color separation suppression layer 15 which are disposed on the side, away from the driving backplane 11, of the light-emitting device layer 12, wherein the color separation suppression layer 15 is configured to interfere with and cancel out external ambient light, so as to reduce the external ambient light incident on the light-emitting device layer 12 and the driving backplane 11 and block the external ambient light reflected by the light-emitting device layer 12 and the driving backplane 11 from exiting from a light-exiting surface of the display panel.

In actual products, the driving backplane 11 comprises a substrate, an active layer arranged on the substrate, a grid insulating layer covering the substrate and the active layer, a grid layer arranged on the grid insulating layer, an interlayer dielectric layer covering the grid layer and the grid insulating layer, a source-drain electrode layer arranged on the interlayer dielectric layer, a passivation layer covering the source-drain electrode layer and the interlayer dielectric layer, and a flat layer arranged on the passivation layer.

The grid layer comprises grid lines distributed along a row direction of the display panel and grids of transistors, and the grid lines and the grids of the transistors are arranged on the same layer and are connected; the source-drain electrode layer comprises data lines distributed along a column direction of the display panel and sources and drains of the transistors, and the data lines and the sources and drains of the transistors are arranged on the same layer; and the data lines are connected with the sources of the transistors, the sources are connected with the active layer through first via holes penetrating the interlayer dielectric layer and the grid insulating layer, and the drains are connected with the active layer through second via holes penetrating the interlayer dielectric layer and the grid insulating layer.

It should be noted that the specific structure of the driving backplane 11 is not limited to the above-mentioned structure, but can be other structures as long as it can drive the light-emitting device layer 12 to emit light, which is not limited by the embodiment of the disclosure.

In addition, the light-emitting device layer 12 is disposed on the driving backplane 11, and the encapsulation layer 13, the color film layer 14 and the color separation suppression layer 15 are disposed on the side, away from the driving backplane 11, of the light-emitting device layer 12.

The light-emitting device layer 12 comprises an anode layer 121 disposed on the driving backplane 11 and a pixel defining layer 122 disposed on the anode layer 121, and the pixel defining layer 122 has a plurality of opening areas. The light-emitting device layer 12 further comprises an organic functional layer 123 disposed in the opening areas, and a cathode layer 124 covering the pixel defining layer 122 and the organic functional layer 123.

The organic functional layer 123 may comprise only a luminescent layer, or may comprise a hole injection layer, a hole transporting layer, a luminescent layer, an electron transporting layer and an electron injection layer. The anode layer 121, the pixel defining layer 122, the organic functional layer 123 and the cathode layer 124 in the light-emitting device layer 12 together form a plurality of light-emitting devices in the light-emitting device layer 12, and the driving backplane 11 drives each light-emitting device to or not to emit light and controls emitted-light brightness, so as to realize image display of the display panel.

The encapsulation layer 13 is used to encapsulate the light-emitting device layer 12 and the driving backplane 11, so as to prevent water and oxygen from entering the light-emitting device layer 12 and the driving backplane 11 to cause failures of the display panel. The encapsulation layer 13 may be a thin film encapsulation structure, which comprises a first inorganic encapsulation layer, an organic encapsulation layer and a second inorganic encapsulation layer. Of course, the encapsulation layer 13 may comprise an organic encapsulation layer only or an inorganic encapsulation layer only, and there may be one or multiple organic encapsulation layers and inorganic encapsulation layers, which is not limited by the embodiment of the disclosure.

The color film layer 14 is used to reduce the reflection intensity of external ambient light on the display panel. However, due to the high transmittance of the color film layer 14, it may allow too much external ambient light to enter the display panel. Therefore, in the embodiment of the disclosure, the color separation suppression layer 15 is added to the display panel, and the color separation suppression layer 15 interferes with and cancels out the directly incident external ambient light so as to reduce the external ambient light incident on the light-emitting device layer 12 and the driving backplane 11, that is, to reduce the external ambient light entering the display panel. When the external ambient light entering the display panel is reduced, the color separation phenomenon of the display panel is reduced accordingly. Other external ambient light entering the display panel through the color separation suppression layer 15 will be incident on the light-emitting device layer 12 and the driving backplane 11 and reflected on the light-emitting device layer 12 and the driving backplane 11, specifically, reflected on the anode layer 121 in the light-emitting device layer 12 and the lines in the driving backplane 11 (such as the grid lines, and the data lines). In actual products, the flatness of the driving backplane 11 is not good under the influence of the lines in the driving backplane 11. The poor flatness of the driving backplane leads to poor flatness of the anode layer 121 in the light-emitting device layer 12. After the external ambient light is reflected on the anode layer 121 in the light-emitting device layer 12, the reflected external ambient light will converge towards some directions. If the reflected external ambient light directly exits from the light-exiting surface of the display panel, color separation will occur. However, in the embodiment of the disclosure, by arranging the color separation suppression layer 15, the color separation suppression layer 15 interferes with and cancels out the reflected external ambient light, so that the reflected external ambient light is blocked by the color separation suppression layer 15 after entering the color separation suppression layer 15, thereby reducing the exiting of the reflected external ambient light from the light-exiting surface of the display panel, alleviating the color separation phenomenon of the display panel and improving the display effect of the display panel.

In the embodiment of the disclosure, the color separation suppression layer 15 comprises at least one barrier layer, four times of the product of the thickness and refractive index of each barrier layer is an odd multiple of a preset wavelength, and the preset wavelength is the wavelength corresponding to the external ambient light that the barrier layer needs to interfere with and cancel out.

As shown in FIGS. 1 to 3, the color separation suppression layer 15 comprises two barrier layers, such as a first barrier layer 151 and a second barrier layer 152, and the first barrier layer 151 is disposed on one side, near the light-emitting device layer 12, of the second barrier layer 152. It is assumed that the thickness of the first barrier layer 151 is d1, the refractive index of the first barrier layer 151 is n1, the thickness of the second barrier layer 152 is d2, the refractive index of the second barrier layer 152 is n2, the wavelength corresponding to the external ambient light that the first barrier layer 151 needs to interfere with and cancel out is $\lambda 1$, and the wavelength corresponding to the external ambient light that the second barrier layer 152 needs to interfere with and cancel out is $\lambda 2$.

External ambient light A is incident on the surface, away from the light-emitting device layer 12, of the second barrier layer 152 to be reflected, and reflected light is B1. Some other external ambient light will be refracted into the second barrier layer 152, and reflected again on a surface between the second barrier layer 152 and the first barrier layer 151, and reflected light is B2. Still other external ambient light will continue to be refracted into the first barrier layer 151 and reflected on the surface, near the light-emitting device layer 12, of the first barrier layer 151, and reflected light is B3. The remaining external ambient light will be incident on the light-emitting device layer 12 and the driving backplane 11.

The phase difference between two light beams is $\Delta\varphi=(2\pi/\lambda)\times\Delta D$, $\lambda$ is the wavelength of light, and $\Delta D$ is the optical path difference between two light beams. Therefore, for the reflected light B1 and B2, the optical path difference $\Delta D=2\times n2\times d2$, and the corresponding phase difference is $\Delta\varphi=(4\pi/\lambda)\times n2\times d2$; and for the reflected light B2 and B3, the optical path difference $\Delta D=2\times n1\times d1$, and the corresponding phase difference is $\Delta\varphi=(4\pi/\lambda)\times n1\times d1$.

To interfere with and cancel out the external ambient light with the wavelength $\lambda 2$ in the reflected light B1 and B2, the phase difference should be an odd multiple of $\pi$, that is, $m\times\pi=(4\pi/\lambda 2)\times n2\times d2$, so $4\times n2\times d2/\lambda 2=m$, where m is a positive odd number, such as 1, 3 and 5.

To interfere with and cancel out the external ambient light with the wavelength λ1 in the reflected light B2 and B3, the phase difference should be an odd multiple of π, that is, m×π=(4π/λ1)×n1×d1, so 4×n1×d1/λ1=m, where m is a positive odd number, such as 1, 3 and 5.

The first barrier layer 151 can interfere with and cancel out the external ambient light with the wavelength λ1 by setting its thickness d1 and refractive index n1 reasonably, and the second barrier layer 152 can interfere with and cancel out the external ambient light with the wavelength λ2 by setting its thickness d2 and refractive index n2 reasonably.

Since the first barrier layer 151 and the second barrier layer 152 interfere with and cancel out some light of certain wavelengths in the incident external ambient light, the external ambient light incident on the light-emitting device layer 12 and the driving backplane 11 is reduced. Other external ambient light incident on the light-emitting device layer 12 and the driving backplane 11 will be reflected on the light-emitting device layer 12 and the driving backplane 11. After the reflected external ambient light is incident on the color separation suppression layer 15 again, the first barrier layer 151 interferes with and cancels out the reflected external ambient light with the wavelength λ1, and the second barrier layer 152 interferes with and cancels out the reflected external ambient light with the wavelength λ2, thus further reducing the exiting of the reflected external ambient light from the light-exiting surface of the display panel, which can alleviate the color separation phenomenon of the display panel.

It should be noted that the above only analyzes the process that the color separation suppression layer 15 interferes with and cancels out the directly incident external ambient light. For the external ambient light reflected by the light-emitting device layer 12 and the driving backplane 11, the principle of interference cancellation is similar, so it is not repeated here.

Further, the color separation suppression layer 15 comprises at least two barrier layers, and the wavelengths corresponding to external ambient light that any two barrier layers interfere with and cancel out are different.

For example, the color separation suppression layer 15 comprises two barrier layers, namely a first barrier layer 151 and a second barrier layer 152. The first barrier layer 151 can interfere with and cancel out external ambient light with the wavelength λ1, the second barrier layer 152 can interfere with and cancel out external ambient light with the wavelength λ2, and the wavelength λ1 and the wavelength λ2 are different. If the wavelength λ1 is the wavelength corresponding to red light and the wavelength λ2 is the wavelength corresponding to green light, then the first barrier layer 151 can interfere with and cancel out red light in the external ambient light, and the second barrier layer 152 can interfere with and cancel out green light in the external ambient light.

By making the wavelengths corresponding to the external ambient light that different barrier layers of the color separation suppression layer 15 interfere with and cancel out different, the color separation suppression layer 15 can interfere with and cancel out more external ambient light, thereby further alleviating the color separation phenomenon of the display panel.

When the number of barrier layers included in the color separation suppression layer 15 is increased, more external ambient light will be subjected to interference cancellation, and the effect of alleviating the color separation phenomenon of the display panel is better. In actual products, the specific number of barrier layers included in the color separation suppression layer 15 can be set as needed.

Specifically, the material of the color separation suppression layer 15 can be an organic material, metal, metal oxides and other materials, and the material of the color separation suppression layer 15 can be selected according to actual requirements, which is not limited by the embodiment of the disclosure.

In the embodiment of the disclosure, the encapsulation layer 13, the color film layer 14 and the color separation suppression layer 15 may be arranged in the following six ways.

The first arrangement way: as shown in FIG. 1 and FIG. 3, the encapsulation layer 13, the color film layer 14 and the color separation suppression layer 15 are sequentially arranged away from the light-emitting device layer 12 in the direction perpendicular to the light-emitting device layer 12.

That is, the encapsulation layer 13 is disposed on the side, away from the driving backplane 11, of the light-emitting device layer 12, the color film layer 14 is disposed on the side, away from the light-emitting device layer 12, of the encapsulation layer 13, and the color separation suppression layer 15 is disposed on the side, away from the encapsulation layer 13, of the color film layer 14.

The second arrangement way: as shown in FIG. 2, the encapsulation layer 13, the color separation suppression layer 15 and the color film layer 14 are sequentially arranged away from the light-emitting device layer 12 in the direction perpendicular to the light-emitting device layer 12.

That is, the encapsulation layer 13 is disposed on the side, away from the driving backplane 11, of the light-emitting device layer 12, the color separation suppression layer 15 is disposed on the side, away from the light-emitting device layer 12, of the encapsulation layer 13, and the color film layer 14 is disposed on the side, away from the encapsulation layer 13, of the color separation suppression layer 15.

The third arrangement way: the color film layer 14, the encapsulation layer 13, and the color separation suppression layer 15 are sequentially arranged away from the light-emitting device layer 12 in the direction perpendicular to the light-emitting device layer 12.

That is, the color film layer 14 is disposed on the side, away from the driving backplane 11, of the light-emitting device layer 12, the encapsulation layer 13 is disposed on the side, away from the light-emitting device layer 12, of the color film layer 14, and the color separation suppression layer 15 is disposed on the side, away from the color film layer 14, of the encapsulation layer 13.

The fourth arrangement way: the color film layer 14, the color separation suppression layer 15 and the encapsulation layer 13 are sequentially arranged away from the light-emitting device layer 12 along the direction perpendicular to the light-emitting device layer 12.

That is, the color film layer 14 is disposed on the side, away from the driving backplane 11, of the light-emitting device layer 12, the color separation suppression layer 15 is disposed on the side, away from the light-emitting device layer 12, of the color film layer 14, and the encapsulation layer 13 is disposed on the side, away from the color film layer 14, of the color separation suppression layer 15.

The fifth arrangement way: the color separation suppression layer 15, the encapsulation layer 13 and the color film layer 14 are sequentially arranged away from the light-emitting device layer 12 in the direction perpendicular to the light-emitting device layer 12.

That is, the color separation suppression layer 15 is disposed on the side, away from the driving backplane 11, of the light-emitting device layer 12, the encapsulation layer 13 is disposed on the side, away from the light-emitting device layer 12, of the color separation suppression layer 15, and the color film layer 14 is disposed on the side, away from the color separation suppression layer 15, of the encapsulation layer 13.

The sixth arrangement way: the color separation suppression layer 15, the color film layer 14 and the encapsulation layer 13 are sequentially arranged away from the light-emitting device layer 12 along the direction perpendicular to the light-emitting device layer 12.

That is, the color separation suppression layer 15 is disposed on the side, away from the driving backplane 11, of the light-emitting device layer 12, the color film layer 14 is disposed on the side, away from the light-emitting device layer 12, of the color separation suppression layer 15, and the encapsulation layer 13 is disposed on the side, away from the color separation suppression layer 15, of the color film layer 14.

In an alternative embodiment of the disclosure, the material of the pixel defining layer 122 is a black shading material. For example, the material of the pixel defining layer 122 may be a black resin material or the like.

By making the pixel defining layer 122 with a black shading material, the pixel defining layer 122 can absorb the external ambient light incident on the pixel defining layer 122, which further reduces the external ambient light incident on the anode layer 121 and the driving backplane 11, so that the external ambient light exiting from the light-exiting surface of the display panel is reduced accordingly, thereby further alleviating the color separation phenomenon of the display panel.

In another alternative embodiment of the disclosure, as shown in FIG. 3, the light-emitting device layer 12 further comprises a light shielding layer 125 disposed between the pixel defining layer 122 and the cathode layer 124, and the light shielding layer 125 is located on the surface, away from the driving backplane 11, of the pixel defining layer 122. The material of the light shielding layer 125 is a black shading material. For example, the material of the light shielding layer 125 may be MoOx or a black resin material.

By adding the light shielding layer 125 between the pixel defining layer 122 and the cathode layer 124 and making the light shielding layer 125 with a black shading material, the light shielding layer 125 can absorb the external ambient light incident on the light shielding layer 125, which further reduces the external ambient light incident on the anode layer 121 and the driving backplane 11, so that the external ambient light exiting from the light-exiting surface of the display panel is reduced accordingly, thereby further alleviating the color separation phenomenon of the display panel.

In the embodiment of the disclosure, the color film layer 14 comprises a plurality of color film units, and each color film unit comprises a color resistance unit 141 and a black matrix 142 surrounding the color resistance unit 141, wherein a front projection of the color resistance unit 141 on the driving backplane 11 covers a front projection of the organic functional layer 123 in the corresponding opening area on the driving backplane 11, and a front projection of the black matrix 142 on the driving backplane 11 is located within a front projection of a peripheral area between two adjacent opening areas on the driving backplane 11.

That is, the front projection of the black matrix 142 on the driving backplane 11 is located within a front projection of the pixel defining layer 122 on the driving backplane 11.

The color resistance units 141 in the color film layer 14 can be divided into three categories, namely first color resistance units, second color resistance units and third color resistance units. The first color resistance units allow red light but do not allow other light to pass through, the second color resistance units allow green light but do not allow other light to pass through, and the third color resistance units allow blue light but do not allow other light to pass through.

The external ambient light is filtered by the color film layer 14 and the color separation suppression layer 15, so that the external ambient light exiting from the light-exiting surface of the display panel is reduced, thereby alleviating the color separation phenomenon of the display panel. In addition, since there is less external ambient light exiting from the light-exiting surface of the display panel, the contrast of the display panel can be improved.

In the embodiment of the disclosure, the color separation suppression layer is added to the display panel, and the color separation suppression layer interferes with and cancels out the directly incident external ambient light so as to reduce the external ambient light incident on the light-emitting device layer and the driving backplane, that is, to reduce the external ambient light entering the display panel. In addition, after the external ambient light incident on the light-emitting device layer and the driving backplane is reflected on the light-emitting device layer and the driving backplane, the reflected external ambient light is incident on the color separation suppression layer again, and the color separation suppression layer interferes with and cancels out the reflected external ambient light again to prevent the reflected external ambient light from exiting from the light-exiting surface of the display panel, thereby alleviating the color separation phenomenon of the display panel and improving the display effect of the display panel.

Figure 4:
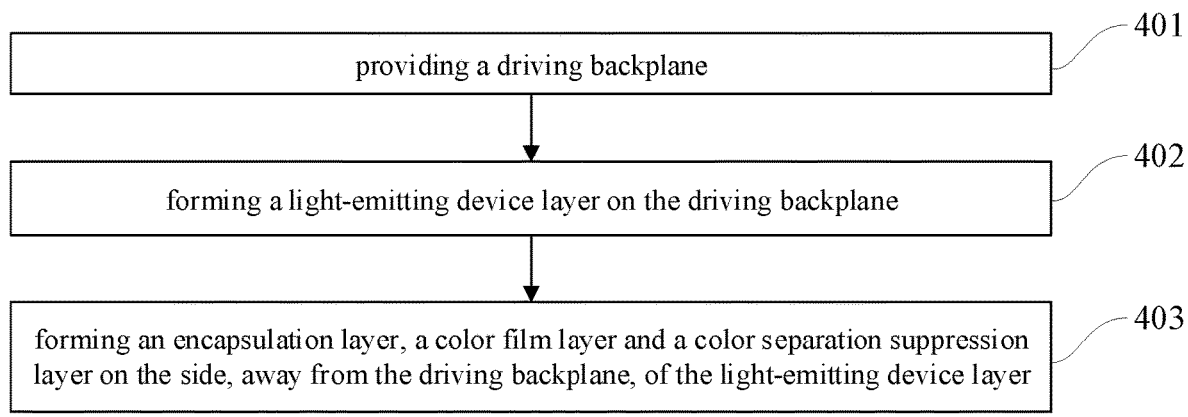
FIG. 4 is a flowchart of a manufacturing method of a display panel according to an embodiment of the disclosure.

FIG. 4 is a flowchart of a manufacturing method of a display panel according to an embodiment of the disclosure, which may specifically comprise the following steps:

Step 401, providing a driving backplane.

In the embodiment of the disclosure, the driving backplane 11 for driving a light-emitting device layer 12 to emit light is prepared first.

Specifically, an active layer is formed on a substrate by using a patterning process, a grid insulating layer covering the active layer and the substrate is formed, a grid layer is formed on the grid insulating layer by using a patterning process, an interlayer dielectric layer covering the grid layer and the grid insulating layer is formed, first via holes and second via holes penetrating the interlayer dielectric layer and the grid insulating layer are formed, and then a source-drain electrode layer is formed on the interlayer dielectric layer by adopting a patterning process, wherein the source-drain electrode layer comprises data lines and sources and drains of transistors, the sources are connected with the active layer through the first via holes penetrating the interlayer dielectric layer and the grid insulating layer, and the drains are connected with the active layer through the second via holes penetrating the interlayer dielectric layer and the grid insulating layer; and finally, a passivation layer covering the source-drain electrode layer and the interlayer dielectric layer is formed, and a flat layer is formed on the passivation layer to obtain the driving backplane 11.

Step 402, forming a light-emitting device layer on the driving backplane.

In the embodiment of the disclosure, after the driving backplane 11 is prepared, the light-emitting device layer 12 is formed on the driving backplane 11.

Specifically, Step 402 includes sub-steps 4021 to 4024:

sub-step 4021, forming an anode layer on the driving backplane;

sub-step 4022, forming a pixel defining layer on the anode layer, wherein the pixel defining layer has a plurality of opening areas;

sub-step 4023, forming an organic functional layer in the opening areas; and sub-step 4024, forming a cathode layer covering the pixel defining layer and the organic functional layer.

First, the anode layer 121 is formed on the driving backplane 11 by a patterning process. Specifically, the anode layer 121 is formed on the flat layer in the driving backplane 11, and the anode layer 121 is connected with the drains in the source-drain electrode layer through third via holes penetrating the flat layer and the passivation layer.

Then, the pixel defining layer 122 is formed on the anode layer 121, and the pixel defining layer has a plurality of opening areas.

Then, the organic functional layer 123 is formed in the opening areas of the pixel defining layer 122, and the organic functional layer 123 is in contact with the anode layer 121. Specifically, the organic functional layer 123 may be formed in the opening areas of the pixel defining layer 122 by a printing process or an evaporation process. The organic functional layer may comprise only a luminescent layer, or may comprise a hole injection layer, a hole transporting layer, a luminescent layer, an electron transporting layer, and an electron injection layer which are sequentially disposed on the side, away from the driving backplane 11, of the anode layer 121.

Finally, the cathode layer 124 covering the pixel defining layer 122 and the organic functional layer 123 is formed, and the material of the cathode layer 124 is a conductive material with high transmittance.

In order to further reduce the external ambient light exiting from the light-exiting surface of the display panel, the pixel defining layer 122 may be made of a black shading material.

Further, after sub-step 4022, Step 402 further comprises: forming a light shielding layer on the surface, away from the driving backplane, of the pixel defining layer, wherein the cathode layer also covers the light shielding layer, and the light shielding layer is made of a black shading material.

Of course, in order to further reduce the external ambient light exiting from the light-exiting surface of the display panel, the pixel defining layer 122 can also be made of a common transparent material. However, the light shielding layer 125 needs to be formed on the surface, away from the driving backplane 11, of the pixel defining layer 122, and the material of the light shielding layer 125 is a black shading material.

That is, after the pixel defining layer 122 is formed on the anode layer 121, the light shielding layer 125 is formed on the surface, away from the driving backplane 11, of the pixel defining layer 122, then the organic functional layer 123 is formed in the opening areas of the pixel defining layer 122, and finally the cathode layer 124 covering the pixel defining layer 122, the organic functional layer 123 and the light shielding layer 125 is formed to obtain the light-emitting device layer 12.

Step 403, forming an encapsulation layer, a color film layer and a color separation suppression layer on the side, away from the driving backplane, of the light-emitting device layer.

In the embodiment of the disclosure, after the light-emitting device layer 12 is formed on the driving backplane 11, the encapsulation layer 13, the color film layer 14 and the color separation suppression layer 15 are formed on the side, away from the driving backplane 11, of the light-emitting device layer 12.

The color separation suppression layer 15 is configured to interfere with and cancel out external ambient light, so as to reduce the external ambient light incident on the light-emitting device layer 12 and the driving backplane 11 and block the external ambient light reflected by the light-emitting device layer 12 and the driving backplane 11 from exiting from a light-exiting surface of the display panel.

Specifically, in a first embodiment, Step 403 specifically comprises: sequentially forming the encapsulation layer, the color film layer and the color separation suppression layer on the side, away from the driving backplane, of the light-emitting device layer.

After forming the light-emitting device layer 12 on the driving backplane 11, the encapsulation layer 13 is formed on the side, away from the driving backplane 11, of the light-emitting device layer 12 first, then the color film layer 14 is formed on the side, away from the light-emitting device layer 12, of the encapsulation layer 13, and finally the color separation suppression layer 15 is formed on the side, away from the encapsulation layer 13, of the color film layer 14.

In a second embodiment, Step 403 specifically comprises: sequentially forming the encapsulation layer, the color separation suppression layer and the color film layer on the side, away from the driving backplane, of the light-emitting device layer.

After forming the light-emitting device layer 12 on the driving backplane 11, the encapsulation layer 13 is formed on the side, away from the driving backplane 11, of the light-emitting device layer 12, then the color separation suppression layer 15 is formed on the side, away from the light-emitting device layer 12, of the encapsulation layer 13, and finally the color film layer 14 is formed on the side, away from the encapsulation layer 13, of the color separation suppression layer 15.

In a third embodiment, Step 403 specifically comprises: sequentially forming the color film layer, the encapsulation layer and the color separation suppression layer on the side, away from the driving backplane, of the light-emitting device layer.

After forming the light-emitting device layer 12 on the driving backplane 11, the color film layer 14 is formed on the side, away from the driving backplane 11, of the light-emitting device layer 12, then the encapsulation layer 13 is formed on the side, away from the light-emitting device layer 12, of the color film layer 14, and finally the color separation suppression layer 15 is formed on the side, away from the color film layer 14, of the encapsulation layer 13.

In a fourth embodiment, Step 403 specifically comprises: sequentially forming the color film layer, the color separation suppression layer and the encapsulation layer on the side, away from the driving backplane, of the light-emitting device layer.

After forming the light-emitting device layer 12 on the driving backplane 11, the color film layer 14 is formed on the side, away from the driving backplane 11, of the light-emitting device layer 12, then the color separation suppression layer 15 is formed on the side, away from the light-emitting device layer 12, of the color film layer 14, and finally the encapsulation layer 13 is formed on the side, away from the color film layer 14, of the color separation suppression layer 15.

In a fifth embodiment, Step 403 specifically comprises: sequentially forming the color separation suppression layer, the encapsulation layer and the color film layer on the side, away from the driving backplane, of the light-emitting device layer.

After forming the light-emitting device layer 12 on the driving backplane 11, the color separation suppression layer 15 is formed on the side, away from the driving backplane 11, of the light-emitting device layer 12, then the encapsulation layer 13 is formed on the side, away from the light-emitting device layer 12, of the color separation suppression layer 15, and finally the color film layer 14 is formed on the side, away from the color separation suppression layer 15, of the encapsulation layer 13.

In a sixth embodiment, Step 403 specifically comprises: sequentially forming the color separation suppression layer, the color film layer and the encapsulation layer on the side, away from the driving backplane, of the light-emitting device layer.

After forming the light-emitting device layer 12 on the driving backplane 11, the color separation suppression layer 15 is formed on the side, away from the driving backplane 11, of the light-emitting device layer 12, the color film layer 14 is formed on the side, away from the light-emitting device layer 12, of the color separation suppression layer 15, and finally the encapsulation layer 13 is formed on the side, away from the color separation suppression layer 15, of the color film layer 14.

It should be noted that the specific forming process of the color separation suppression layer 15 is related to the material used, and the process may be a physical vapor deposition (PVD) process or a chemical vapor deposition (CVD) process.

In the embodiment of the disclosure, the color separation suppression layer is added to the display panel, and the color separation suppression layer interferes with and cancels out the directly incident external ambient light so as to reduce the external ambient light incident on the light-emitting device layer and the driving backplane, that is, to reduce the external ambient light entering the display panel. In addition, after the external ambient light incident on the light-emitting device layer and the driving backplane is reflected on the light-emitting device layer and the driving backplane, the reflected external ambient light is incident on the color separation suppression layer again, and the color separation suppression layer interferes with and cancels out the reflected external ambient light again to prevent the reflected external ambient light from exiting from the light-exiting surface of the display panel, thereby alleviating the color separation phenomenon of the display panel and improving the display effect of the display panel.

Figure 5:
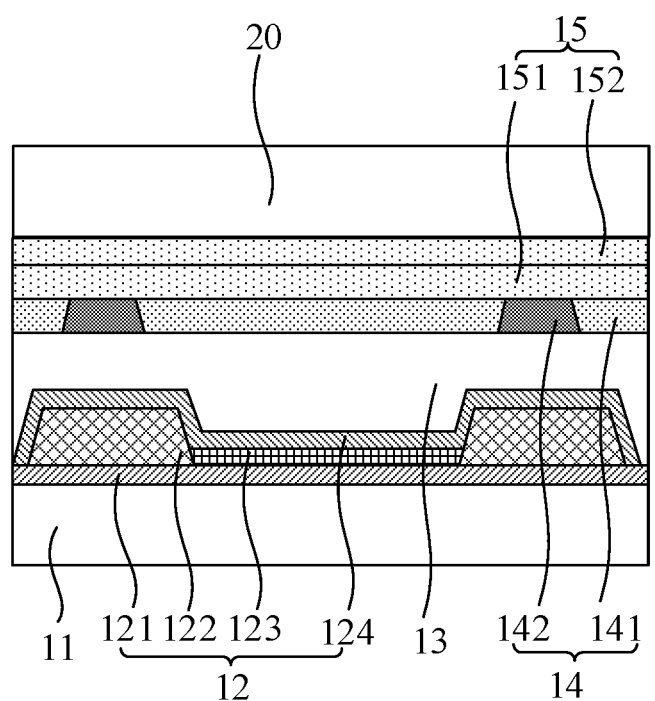
FIG. 5 is a structural diagram of a displaying device according to an embodiment of the disclosure.

FIG. 5 is a structural diagram of a displaying device according to an embodiment of the disclosure.

An embodiment of the disclosure provides a displaying device, which comprises a cover plate 20 and the above-mentioned display panel. The cover plate 20 is disposed on the light-exiting surface of the display panel.

The cover plate 20 may be a glass cover plate for protecting the display panel. When the encapsulation layer 13, the color film layer 14 and the color separation suppression layer 15 are sequentially arranged on the side, away from the driving backplane 11, of the light-emitting device layer 12, the cover plate 20 is arranged on the side, away from the color film layer 14, of the color separation suppression layer 15. When the encapsulation layer 13, the color separation suppression layer 15 and the color film layer 14 are sequentially arranged on the side, away from the driving backplane 11, of the light-emitting device layer 12, the cover plate 20 is arranged on the side, away from the color separation suppression layer 15, of the color film layer 14. When the color film layer 14, the encapsulation layer 13 and the color separation suppression layer 15 are sequentially arranged on the side, away from the driving backplane 11, of the light-emitting device layer 12, the cover plate 20 is arranged on the side, away from the encapsulation layer 13, of the color separation suppression layer 15. When the color film layer 14, the color separation suppression layer 15 and the encapsulation layer 13 are sequentially arranged on the side, away from the driving backplane 11, of the light-emitting device layer 12, the cover plate 20 is arranged on the side, away from the color separation suppression layer 15, of the encapsulation layer 13. When the color separation suppression layer 15, the encapsulation layer 13 and the color film layer 14 are sequentially arranged on the side, away from the driving backplane 11, of the light-emitting device layer 12, the cover plate 20 is arranged on the side, away from the encapsulation layer 13, of the color film layer 14. When the color separation suppression layer 15, the color film layer 14 and the encapsulation layer 13 are sequentially arranged on the side, away from the driving backplane 11, of the light-emitting device layer 12, the cover plate 20 is arranged on the side, away from the color film layer 14, of the encapsulation layer 13.

One can refer to the description of the above embodiments for the specific description of the display panel, which will not be described in detail in the embodiment of this disclosure.

The displaying device also comprises other functional devices such as a touch panel and a fingerprint recognition device, which can be disposed between the cover plate 20 and the display panel, and of course, can also be disposed at other positions, which is not limited by the embodiment of the disclosure.

In practical application, the displaying device can be any product or component with a display function, such as mobile phone, tablet computer, display, notebook computer and navigator.

In the embodiment of the disclosure, the color separation suppression layer is added to the display panel, and the color separation suppression layer interferes with and cancels out the directly incident external ambient light so as to reduce the external ambient light incident on the light-emitting device layer and the driving backplane, that is, to reduce the external ambient light entering the display panel. In addition, after the external ambient light incident on the light-emitting device layer and the driving backplane is reflected on the light-emitting device layer and the driving backplane, the reflected external ambient light is incident on the color separation suppression layer again, and the color separation suppression layer interferes with and cancels out the reflected external ambient light again to prevent the reflected external ambient light from exiting from the light-exiting surface of the display panel, thereby alleviating the color separation phenomenon of the display panel and improving the display effect of the display panel.

For the sake of simple description, all the aforementioned method embodiments are expressed as a series of action combinations, but those skilled in the art should know that this disclosure is not limited by the described action sequence, because according to this disclosure, some steps can be performed in other sequences or at the same time. Those skilled in the art should also know that the embodiments described in the specification are all preferred embodiments, and the actions and modules involved are not necessarily a must for this disclosure.

All the embodiments in this specification are described in a progressive way, and each embodiment focuses on the differences from other embodiments. The same and similar parts among the embodiments are referable to one another.

It should be also noted that herein, relational terms such as first and second are only used to distinguish one entity or operation from another entity or operation, and do not necessarily require or imply any such actual relationship or order between these entities or operations. The terms "comprise", "include" or any other variations thereof, are intended to cover a non-exclusive inclusion, such that a process, method, article, or device which includes a list of elements does not include only those elements but also other elements not expressly listed or inherent to such process, method, article, or device. Without further limitation, an element defined by the statement "includes a . . . " does not exclude the presence of another identical element in a process, method, article or device that includes the element.

The display panel, the manufacturing method thereof and the displaying device provided by the disclosure are described in detail above. Specific examples are applied herein to illustrate the principle and implementation of the disclosure. The above embodiments are only used to help understand the method of the disclosure and its core ideas. For those of ordinary skill in the air, according to the idea of this disclosure, there will be some changes in the specific implementation and application scope. To sum up, the contents of this specification should not be understood as a limitation of this disclosure.

The invention claimed is:

1. A display panel, comprising:
   a driving backplane;
   a light-emitting device layer disposed on the driving backplane; and
   an encapsulation layer, a color film layer and a color separation suppression layer which are disposed on the side, away from the driving backplane, of the light-emitting device layer;
   wherein the color separation suppression layer is configured to interfere with and cancel out external ambient light, so as to reduce the external ambient light incident on the light-emitting device layer and the driving backplane and block the external ambient light reflected by the light-emitting device layer and the driving backplane from exiting from a light-exiting surface of the display panel;
   wherein the color separation suppression layer comprises at least one barrier layer, four times of the product of the thickness and refractive index of each barrier layer is an odd multiple of a preset wavelength, and the preset wavelength is a wavelength corresponding to external ambient light that the barrier layer needs to interfere with and cancel out.

2. The display panel according to claim 1, wherein the color separation suppression layer comprises at least two barrier layers, and the wavelengths corresponding to external ambient light that any two of the barrier layers interfere with and cancel out are different.

3. The display panel according to claim 1, wherein the encapsulation layer, the color film layer and the color separation suppression layer are sequentially arranged away from the light-emitting device layer in the direction perpendicular to the light-emitting device layer.

4. The display panel according to claim 1, wherein the encapsulation layer, the color separation suppression layer and the color film layer are sequentially arranged away from the light-emitting device layer in the direction perpendicular to the light-emitting device layer.

5. The display panel according to claim 1, wherein the color film layer, the encapsulation layer, and the color separation suppression layer are sequentially arranged away from the light-emitting device layer in the direction perpendicular to the light-emitting device layer.

6. The display panel according to claim 1, wherein the color film layer, the color separation suppression layer and the encapsulation layer are sequentially arranged away from the light-emitting device layer along the direction perpendicular to the light-emitting device layer.

7. The display panel according to claim 1, wherein the color separation suppression layer, the encapsulation layer and the color film layer are sequentially arranged away from the light-emitting device layer in the direction perpendicular to the light-emitting device layer.

8. The display panel according to claim 1, wherein the color separation suppression layer, the color film layer and the encapsulation layer are sequentially arranged away from the light-emitting device layer along the direction perpendicular to the light-emitting device layer.

9. The display panel according to claim 1, wherein the material of the color separation suppression layer is an organic material, metal or metal oxides.

10. A displaying device, comprising a cover plate and the display panel according to claim 1; and
    wherein the cover plate is arranged on a light-exiting surface of the display panel.

11. A display panel, comprising:
    a driving backplane;
    a light-emitting device layer disposed on the driving backplane; and
    an encapsulation layer, a color film layer and a color separation suppression layer which are disposed on the side, away from the driving backplane, of the light-emitting device layer;
    wherein the color separation suppression layer is configured to interfere with and cancel out external ambient light, so as to reduce the external ambient light incident on the light-emitting device layer and the driving backplane and block the external ambient light reflected by the light-emitting device layer and the driving backplane from exiting from a light-exiting surface of the display panel;
    wherein the light-emitting device layer comprises an anode layer disposed on the driving backplane and a pixel defining layer disposed on the anode layer, and the pixel defining layer has a plurality of opening areas; and
    the light-emitting device layer further comprises an organic functional layer disposed in the opening areas, and a cathode layer covering the pixel defining layer and the organic functional layer.

12. The display panel according to claim 11, wherein the material of the pixel defining layer is a black shading material.

13. The display panel according to claim 11, wherein the light-emitting device layer further comprises a light shielding layer disposed between the pixel defining layer and the cathode layer, and the light shielding layer is located on the surface, away from the driving backplane, of the pixel defining layer; and
    the material of the light shielding layer is a black shading material.

14. The display panel according to claim 13, wherein the material of the light shielding layer is MoOx or a black resin material.

15. The display panel according to claim 11, wherein the color film layer comprises a plurality of color film units, each color film unit comprises a color resistance unit and a black matrix surrounding the color resistance unit;
- wherein a front projection of the color resistance unit on the driving backplane covers a front projection of the organic functional layer in the corresponding opening area on the driving backplane, and a front projection of the black matrix on the driving backplane is located within a front projection of a peripheral area between two adjacent opening areas on the driving backplane.

16. A manufacturing method of a display panel, comprising:
- providing a driving backplane;
- forming a light-emitting device layer on the driving backplane; and
- forming an encapsulation layer, a color film layer and a color separation suppression layer on the side, away from the driving backplane, of the light-emitting device layer;
- wherein the color separation suppression layer is configured to interfere with and cancel out external ambient light, so as to reduce the external ambient light incident on the light-emitting device layer and the driving backplane and block the external ambient light reflected by the light-emitting device layer and the driving backplane from exiting from a light-exiting surface of the display panel;
- wherein the color separation suppression layer comprises at least one barrier layer, four times of the product of the thickness and refractive index of each barrier layer is an odd multiple of a preset wavelength, and the preset wavelength is a wavelength corresponding to external ambient light that the barrier layer needs to interfere with and cancel out.

17. The manufacturing method of the display panel according to claim 16, wherein forming the encapsulation layer, the color film layer and the color separation suppression layer on the side, away from the driving backplane, of the light-emitting device layer comprises:
- sequentially forming the encapsulation layer, the color film layer and the color separation suppression layer on the side, away from the driving backplane, of the light-emitting device layer;
- or sequentially forming the encapsulation layer, the color separation suppression layer and the color film layer on the side, away from the driving backplane, of the light-emitting device layer;
- or sequentially forming the color film layer, the encapsulation layer and the color separation suppression layer on the side, away from the driving backplane, of the light-emitting device layer;
- or sequentially forming the color film layer, the color separation suppression layer and the encapsulation layer on the side, away from the driving backplane, of the light-emitting device layer;
- or sequentially forming the color separation suppression layer, the encapsulation layer and the color film layer on the side, away from the driving backplane, of the light-emitting device layer;
- or sequentially forming the color separation suppression layer, the color film layer and the encapsulation layer on the side, away from the driving backplane, of the light-emitting device layer.

18. The manufacturing method of the display panel according to claim 16, wherein forming the light-emitting device layer on the driving backplane comprises:
- forming an anode layer on the driving backplane;
- forming a pixel defining layer on the anode layer, wherein the pixel defining layer has a plurality of opening areas;
- forming an organic functional layer in the opening areas; and
- forming a cathode layer covering the pixel defining layer and the organic functional layer.

19. The manufacturing method of the display panel according to claim 18, wherein after forming the pixel defining layer on the anode layer, the method further comprises:
- forming a light shielding layer on the surface, away from the driving backplane, of the pixel defining layer;
- wherein the cathode layer also covers the light shielding layer, and the material of the light shielding layer is a black shading material.

* * * * *